(12) United States Patent
Brown et al.

(10) Patent No.: US 7,513,971 B2
(45) Date of Patent: Apr. 7, 2009

(54) FLAT STYLE COIL FOR IMPROVED PRECISION ETCH UNIFORMITY

(75) Inventors: Karl Brown, Mountain View, CA (US); Vineet Mehta, Sunnyvale, CA (US); See-Eng Phan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 220 days.

(21) Appl. No.: 10/387,948

(22) Filed: Mar. 12, 2003

(65) Prior Publication Data

US 2004/0018740 A1 Jan. 29, 2004

Related U.S. Application Data

(60) Provisional application No. 60/365,128, filed on Mar. 18, 2002.

(51) Int. Cl.
*H01L 21/306* (2006.01)
*C23C 16/00* (2006.01)

(52) U.S. Cl. .................. 156/345.48; 118/723 I

(58) Field of Classification Search .......... 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 4,716,491 A | | 12/1987 | Ohno et al. |
| 4,990,229 A | * | 2/1991 | Campbell et al. ....... 204/298.06 |
| 5,217,560 A | | 6/1993 | Kurono et al. |
| 5,401,350 A | | 3/1995 | Patrick et al. |
| 5,476,182 A | * | 12/1995 | Ishizuka et al. .............. 216/68 |
| 5,614,055 A | | 3/1997 | Fairbairn et al. |
| 5,681,393 A | * | 10/1997 | Takagi ................... 118/723 IR |
| 5,759,280 A | | 6/1998 | Holland et al. |
| 5,811,022 A | | 9/1998 | Savas et al. |
| 5,980,688 A | | 11/1999 | Blalock |
| 6,010,966 A | | 1/2000 | Ionov |
| 6,015,464 A | | 1/2000 | Xia et al. |
| 6,020,686 A | * | 2/2000 | Ye et al. ................ 315/111.51 |
| 6,117,788 A | | 9/2000 | Ko |
| 6,132,551 A | | 10/2000 | Horioka et al. |

(Continued)

FOREIGN PATENT DOCUMENTS

JP 5055043 3/1993

(Continued)

*Primary Examiner*—Luz L. Alejandro
(74) *Attorney, Agent, or Firm*—Konrad Raynes Victor, LLP

(57) ABSTRACT

An RF coil for a plasma etch chamber is provided in which the RF coil is substantially flat over a portion of at least one turn of the coil. In one embodiment, each turn of the coil is substantially flat over a majority of each turn. In one embodiment of the present inventions, each turn of the coil is substantially flat over approximately 300 degrees of the turn. In the final approximate 60 degrees of the turn, the coil is sloped down to the next turn. Each turn thus comprises a substantially flat portion in combination with a sloped portion interconnecting the turn to the next adjacent turn. In one embodiment, the RF coil having turns with substantially flat portions is generally cylindrical. Other shapes are contemplated such as a dome shape. In some applications such as an RF plasma etch reactor, it is believed that providing an RF coil having turns comprising flat portions with sloped portions interconnecting the flat portions can improve uniformity of the etch process.

29 Claims, 5 Drawing Sheets

U.S. PATENT DOCUMENTS

| | | |
|---|---|---|
| 6,248,250 B1 | 6/2001 | Hanawa et al. |
| 6,254,737 B1 | 7/2001 | Edelstein et al. |
| 6,264,812 B1 | 7/2001 | Raaijmakers et al. |
| 6,270,687 B1 | 8/2001 | Ye et al. |
| 6,304,036 B1 | 10/2001 | Freeman et al. |
| 6,312,555 B1 | 11/2001 | Daviet |
| 6,361,661 B2 | 3/2002 | Hong |
| 6,368,469 B1 | 4/2002 | Nulman et al. |
| 6,926,800 B2 * | 8/2005 | Tachino et al. ......... 156/345.48 |
| 2002/0005169 A1 | 1/2002 | Daviet |
| 2002/0008480 A1 | 1/2002 | Yamazaki et al. |
| 2002/0033233 A1 | 3/2002 | Savas |
| 2002/0170677 A1 * | 11/2002 | Tucker et al. .......... 156/345.48 |
| 2002/0185226 A1 * | 12/2002 | Lea et al. ................ 156/345.35 |

FOREIGN PATENT DOCUMENTS

| | | |
|---|---|---|
| JP | 5055185 | 3/1993 |
| JP | 8088218 | 4/1996 |

* cited by examiner

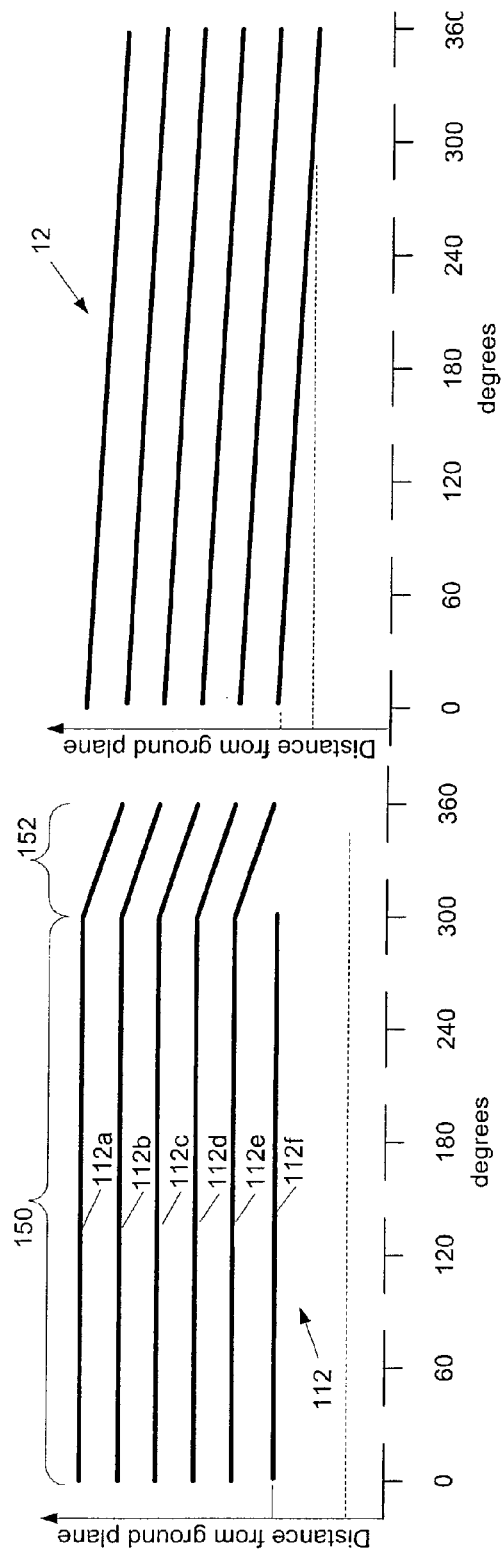
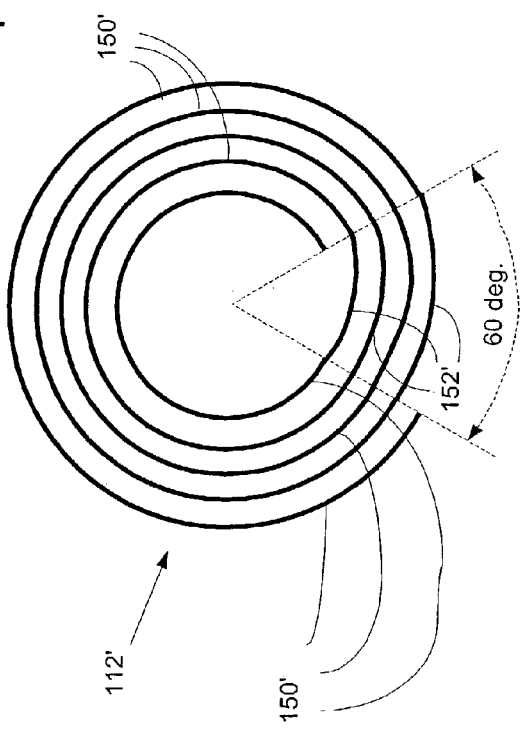
FIG. 6
FIG. 7
FIG. 10

FLAT STYLE COIL FOR IMPROVED PRECISION ETCH UNIFORMITY

RELATED APPLICATIONS

This application claims the benefit of U.S. Provisional Application No. 60/365,128 filed Mar. 18, 2002, which is incorporated by reference in its entirety.

TECHNICAL FIELD

The invention relates to an RF plasma etch reactor, and more particularly to such a reactor employing a coil antenna.

INTRODUCTION

A typical inductively coupled plasma etch reactor of the type currently available is depicted in FIG. 1. This reactor has a vacuum chamber 10 surrounded by an inductive coil 12 external to the vacuum chamber 10. A workpiece 14, usually a semiconductor wafer, is supported inside the chamber 10 on a pedestal 16. An inductive coil antenna 12 is wound around the outside of the chamber 10 and connected to a radio frequency (RF) power generator 18 through an impedance matching network 20 to provide RF power into the chamber. In addition, a bias RF power generator 22 and associated impedance matching circuit 24 is connected to the pedestal 16 and used to impose a bias on the workpiece 14.

A window portion 30 of the chamber walls is composed of an electrically insulating material, typically quartz or ceramic, so as to minimize attenuation of the RF power coupled into the chamber 10. The chamber window portion 30 may be shaped cylindrically as shown in FIG. 1. Alternatively the chamber window portion 30 may be shaped as a dome or partial hemisphere. In both types, the RF coil 12 is wound adjacent the window portion in a generally cylindrical helix shape as shown in FIG. 1. FIG. 2 shows a dome-shaped chamber window portion 30' around which an RF coil 12' typically is wound in a spiral conforming substantially to the dome shape of the window portion 30'.

Underlying the insulative chamber window walls 30 and surrounding the pedestal 16 is a second portion 34 of the chamber, which is typically constructed of a conductive material. This conductive portion 34 is electrically grounded and serves as the ground for the RF power supplied to the pedestal 16. The grounded conductive portion 34 also provides a ground plane with respect to the RF coil 12 or 12'.

Cooling channels 32 are often formed within the conductive portion 34. Coolant fluid is pumped through the channels 32 to transfer heat away from the interior of the chamber 10 so that the chamber temperature can be maintained at a particular level desired for the etch process being performed. The exterior of the chamber window walls 30 may also be cooled for the same reason. However, as insulative materials such as quartz and ceramic generally are not easily formed with internal cooling channels, the exterior surface of the walls 30 are cooled, typically by forced air convection methods.

Etchant gas is introduced into the chamber 10 through gas injection ports 26. A vacuum pump 28 evacuates the chamber 10 to a desired chamber pressure. The pump 28 may be placed at the bottom of the chamber as depicted or alternatively may be placed elsewhere such as at the side of the chamber.

In operation, the chamber is pumped to a subatmospheric pressure (typically below 100 mTorr) and an etchant gas is introduced into the interior of the chamber 10. RF power is inductively coupled from the exterior coil 12 or 12' to generate a plasma within the chamber. The plasma produces etchant species (e.g. ions and radicals) from the etchant gas, which are used to etch the workpiece 14. A component of anisotropic etching processes is the bombardment of the workpiece 14 with ions produced in the plasma. The energy and directionality exhibited by the ions and their density within the plasma are factors which often affect the quality of the resulting etched workpiece 14. These factors affect etch uniformity, etch rate, photoresist selectivity, the straightness of the etch profile, and the smoothness of etch feature sidewalls.

Various materials may be etched from the surface of a workpiece 14, such as aluminum (Al), copper (Cu), platinum (Pt), tantalum (Ta), rhodium (Rh), and titanium (Ti), among others. Non-conductive materials such as oxides may be etched as well.

SUMMARY

An RF coil for a plasma etch chamber is provided in which the RF coil is substantially flat over a portion of at least one turn of the coil. In one embodiment, each turn of the coil is substantially flat over a majority of each turn. In conventional RF coils such as the coil 12 and 12' described above, the coils are typically gradually sloped in a continuous transition from one turn to the next. In one embodiment of the present inventions, each turn of the coil is substantially flat over approximately 300 degrees of the turn. In the final approximate 60 degrees of the turn, the coil is sloped down to the next turn. Each turn thus comprises a substantially flat portion in combination with a sloped portion interconnecting the turn to the next adjacent turn.

In one embodiment, the RF coil having turns with substantially flat portions is shaped generally in a cylindrical shape. Other shapes are contemplated such as a dome shape.

In some applications such as an RF plasma etch reactor, it is believed that providing an RF coil having turns comprising flat portions with sloped portions interconnecting the flat portions can improve uniformity of the etch process. For example, it is believed that asymmetries in the electrostatic fields can be reduced. Other advantages may occur in addition to or instead of these advantages when using an RF coil in accordance with the present inventions.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions.

Thus, in addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

FIG. 6 is a graph schematically representing the substantially flat shape of each turn of the coil of FIG. 5.

FIG. 7 is a graph schematically representing the continuous slope of each turn of the convention coil of FIG. 3.

FIG. 10 is a schematic top view of the coil of FIG. 9.

DETAILED DESCRIPTION OF THE ILLUSTRATED EMBODIMENTS

In the following description of embodiments of the present inventions, reference is made to the accompanying drawings which form a part hereof, and in which are shown by way of illustration specific embodiments in which the invention may be practiced. It is understood that other embodiments may be utilized and structural changes may be made without departing from the scope of the present invention.

Figure 1:
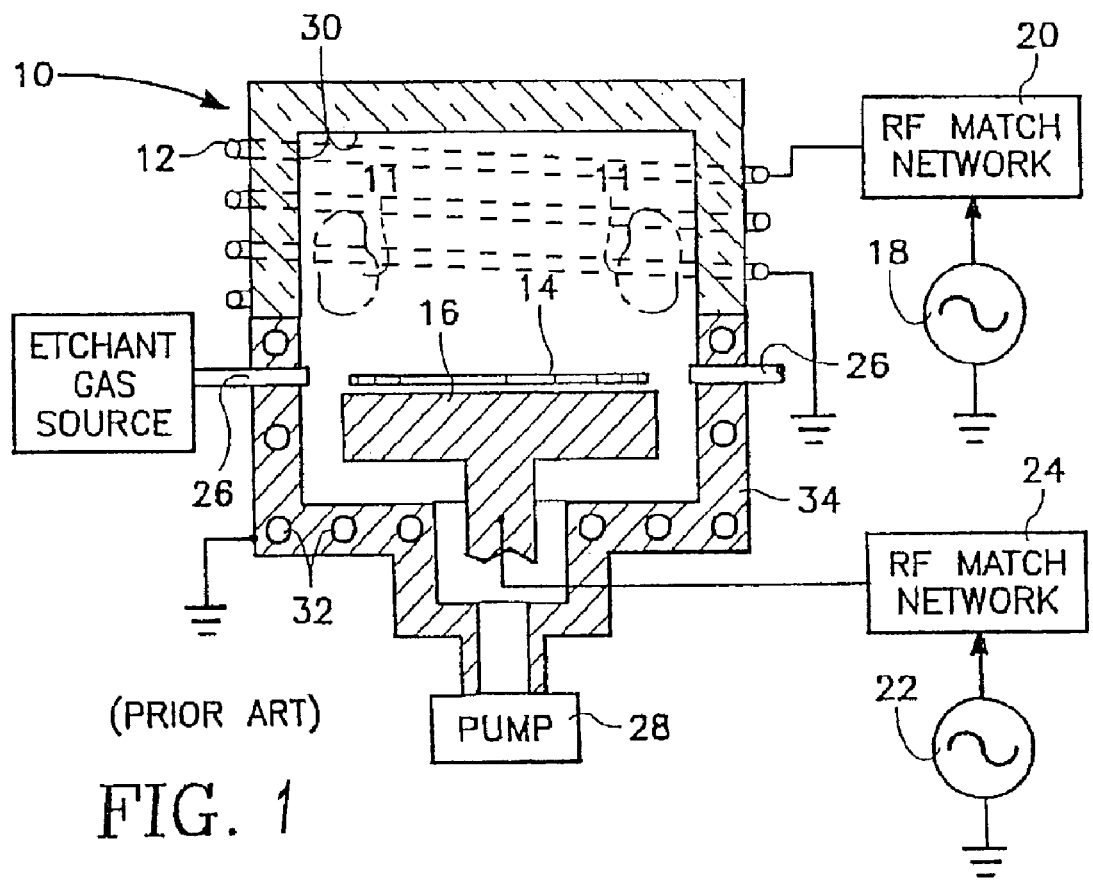
FIG. 1 is a cross-sectional view of a conventional inductively coupled RF plasma etch reactor with a cylindrical chamber window wall portion.
Figure 5:
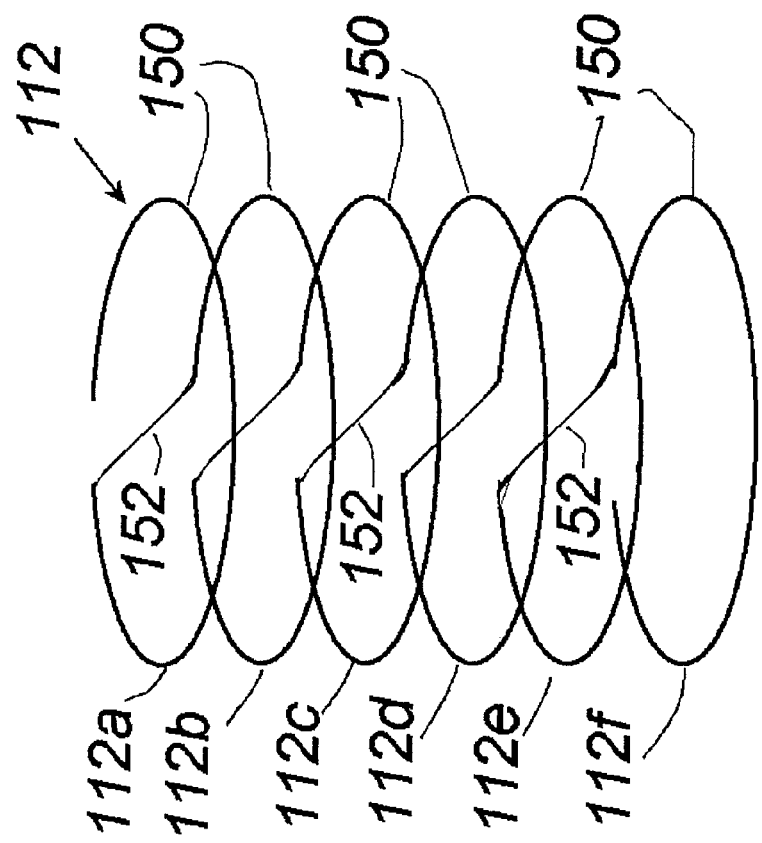
FIG. 5 is an isometric view of the cylindrically-shaped flat turn RF coil of FIG. 4.
Figure 3:
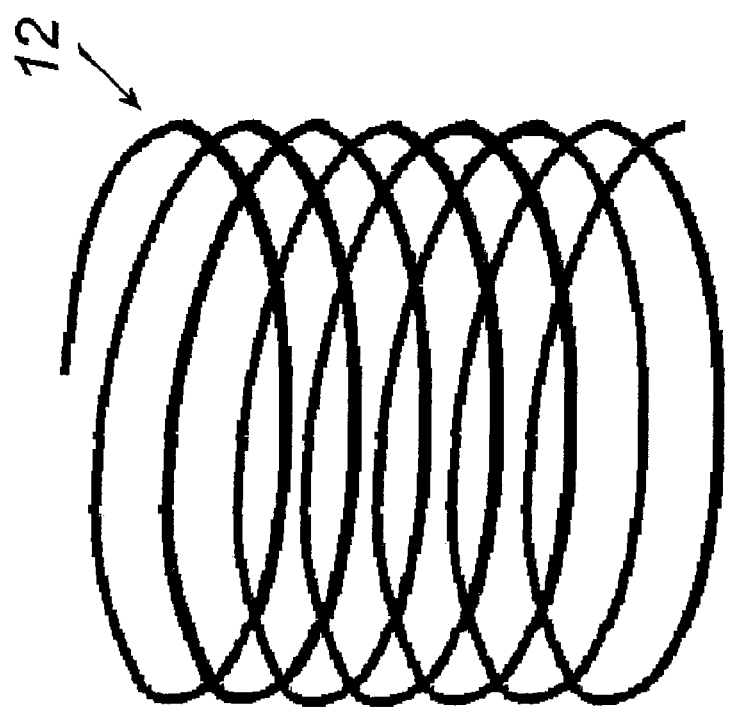
FIG. 3 is an isometric view of a conventional cylindrically-shaped helix type RF coil of FIG. 1.
Figure 4:
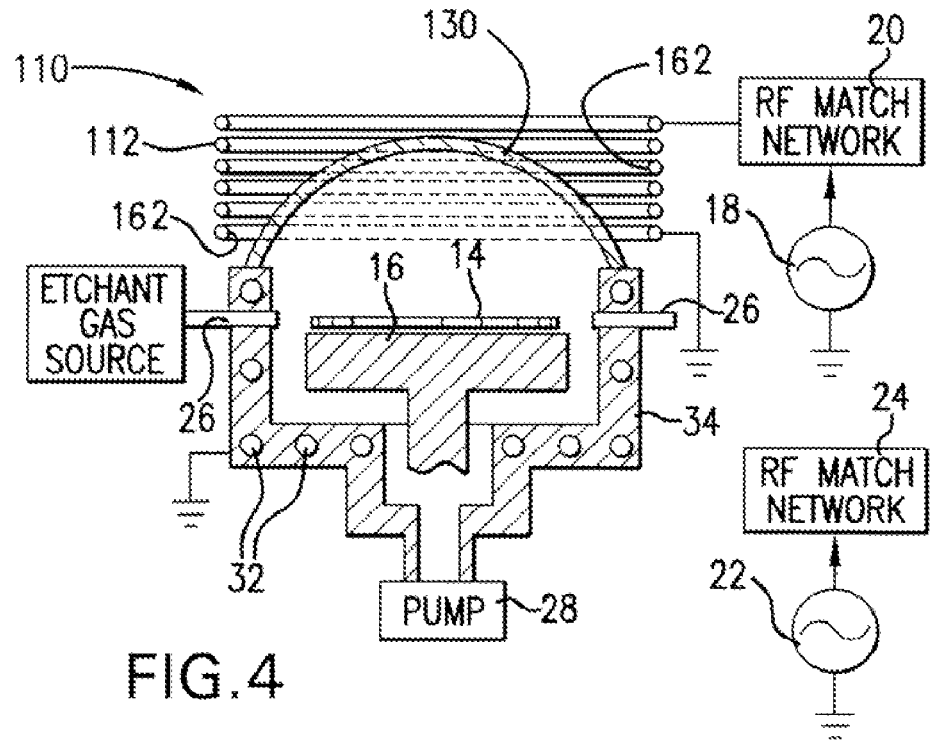
FIG. 4 is a cross-sectional view of an inductively coupled RF plasma etch reactor with a dome-shaped chamber window wall portion and a cylindrical RF coil in accordance with one embodiment of the present inventions.

A plasma etch chamber in accordance with one aspect of the present inventions is indicated generally at 110 in FIG. 4. The chamber 110 has a dome-shaped quartz or ceramic wall portion 130 through which an RF coil 112 external to the chamber 110, inductively couples RF energy into the interior of the chamber 110 in a manner similar to that of the chamber 10 of FIG. 1. However, the coil 112 rather than being continuously sloped as prior RF coils 12, each turn 112a-112e (FIG. 5) of the RF coil 112 comprises a generally flat portion 150 and a sloped portion 152 which interconnects the turn to the next adjacent turn of the coil 112. A final turn 112f of the coil 112 may optionally omit the sloped interconnecting portion 52 as shown in FIG. 5.

As best shown by the graph of FIG. 6, the flat portion 150 of each turn 112a-112f does not slope but instead is positioned relatively parallel to the ground plane provided by the conductive portion 34 of the chamber 110. Thus, the flat portion 150 of each turn is coplanar over the length of the flat portion 150, and is parallel with the flat portions 150 of the other turns. In the embodiment of FIGS. 5 and 6, the flat portion 150 of each turn extends approximately 300 degrees of the full 360 degrees of each turn. It is appreciated that the length of each flat portion 150 relative to each sloped portion 152 may vary, depending upon the particular application. For example, the flat portion may occupy approximately 270-300 degrees of the full 360 circumference of each turn. Other lengths may be suitable as well, depending upon the particular application. The length of the sloped portion 152 is of course affected by the length of the flat portion. The greater the length of the flat portion, the smaller the length of the sloped portion.

In contrast, the prior art coil 12 or 12' is sloped over the entire length of each turn as shown in FIG. 7. Thus, each turn slopes over the full 360 degrees of the circumference of each turn such that the coil slopes continuously from the start to the end of the coil.

The materials of the coil 112 may be conventional. Thus, the coil 112 may be fabricated from copper or silver-plated copper for example. Other conductive materials are suitable as well.

The size of the coil 112 may be conventional as well. Thus, the number of turns, the spacing or pitch between each turn, the diameter of the coil and the cross-sectional shape and thickness of each coil turn will be dependent upon the particular application. In the illustrated embodiment, the coil 112 has six turns 112a-112f. The cross-sectional shape of each turn may be round, oval, square or rectangular, for example. In the illustrated embodiment, each turn is 5 mm thick. The turns are spaced at a pitch of ¾ inch between turns. Other sizes of coils may be suitable as well. Turns of the coil 112 are wound around the window wall portion 130 so that the window wall portion 130 extends through an opening 162 defined by at least a plurality of the turns as shown in FIG. 4.

Figure 2:
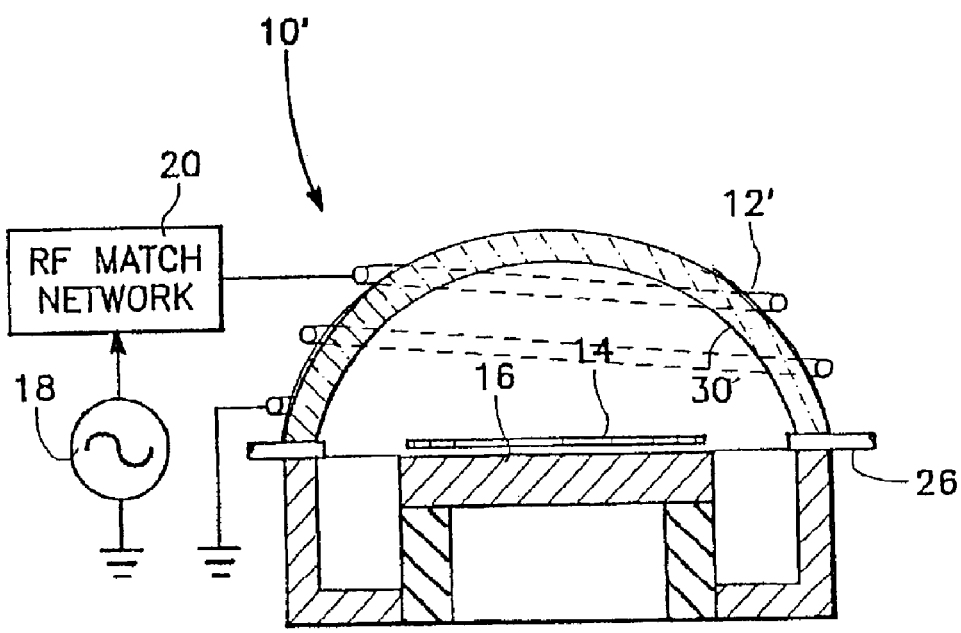
FIG. 2 is a cross-sectional view of another conventional inductively coupled RF plasma etch reactor with a dome-shaped spiral coil and chamber window wall portion.
Figure 8:
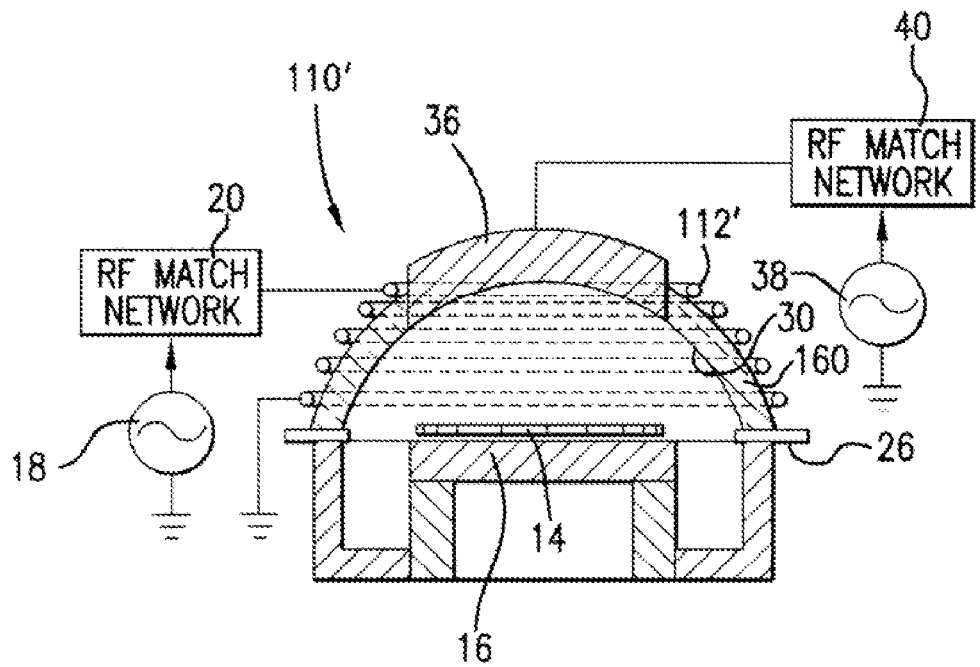
FIG. 8 is a cross-sectional view of an inductively-coupled RF plasma etch reactor with a dome-shaped chamber window wall portion and a dome-shaped RF coil in accordance with an alternative embodiment of the present inventions.
Figure 9:
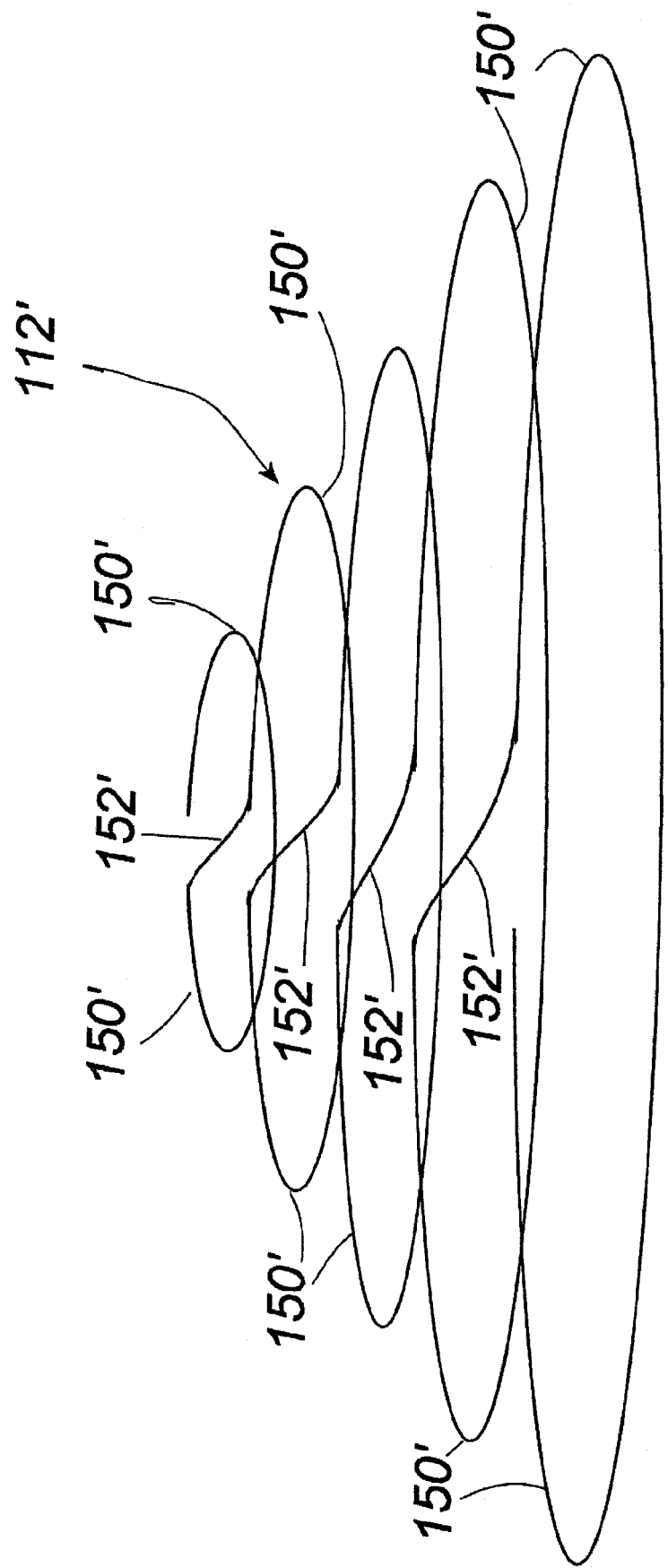
FIG. 9 is an isometric view of the dome-shaped flat turn RF coil of FIG. 8.

The coil 112 is generally cylindrical in shape. It is appreciated that other shapes may be used as well. For example, FIG. 8 shows a chamber 110' having a dome-shaped quartz or ceramic window portion 160 about which is wound a coil 112'. As shown in FIGS. 9 and 10, the coil 112' is spiral wound in turns of increasing diameter, generally following the contours of the chamber window portion 160 to form a dome-shape. However, unlike the coil 12' of FIG. 2, the turns of the coil 112' do not slope continuously. Instead, each turn, like each turn of the coil 112, includes a flat portion 150' and a sloped portion 152'.

The flat portion 150' of each turn of the coil 112' is positioned relatively parallel to the ground plane provided by the conductive portion 34 of the chamber 110'. Thus, the flat portion 150' of each turn is coplanar over the length of the flat portion 150', and is parallel with the flat portions 150' of the other turns. In the embodiment of FIGS. 8-10, the flat portion 150' of each turn extends approximately 300 degrees of the full 360 degrees of each turn. Again, It is appreciated that the length of each flat portion 150' relative to each sloped portion 152' may vary, depending upon the particular application.

The various components of the chambers 110 and 110' of the embodiments of FIGS. 4 and 8 are conventional except for the novel RF coils 112 and 112'. It is appreciated however, that RF coils in accordance with the present inventions may be used with other types of chambers including chambers yet to be developed.

While the invention has been described in detail by specific reference to preferred embodiments, it is understood that variations and modifications thereof may be made without departing from the true spirit and scope of the inventions.

What is claimed is:

1. A plasma etch reactor, comprising:
   a vacuum pressure chamber having a dome-shaped window wall portion;
   a support adapted to support a semiconductor workpiece within said chamber; and
   an RF coil disposed external and adjacent to said window wall portion wherein said coil has a plurality of 360 degree turns including a first 360 degree turn, a second 360 degree turn and a plurality of 360 degree turns between said first and second 360 degree turns, each 360 degree turn being in close physical proximity to an adjacent 360 degree turn and being wound around said window wall portion so that said window wall portion extends through an opening defined by at least a plurality of said turns, each 360 degree turn comprising a flat portion and a sloped portion interconnecting flat portions of adjacent 360 degree turns, wherein each flat portion of each 360 degree turn comprises a majority of the 360 degree turn.

2. The reactor of claim 1 wherein said flat portions are parallel to each other.

3. The reactor of claim 1 wherein a portion of said chamber is formed of a conductive material which provides a ground plane with respect to said coil and wherein said flat coil portions are parallel to said ground plane.

4. The reactor of claim 1 wherein said window wall portion is electrically insulative.

5. The reactor of claim 4 wherein said window wall portion comprises quartz.

6. The reactor of claim 4 wherein said window wall portion comprises a ceramic.

7. The reactor of claim 1 wherein said RF coil is helix wound and cylindrically shaped.

8. The reactor of claim 1 wherein said RF coil is spiral wound and dome-shaped.

9. The reactor of claim 1 wherein said flat portion of each turn is approximately 300 degrees of the circumference of the turn and the sloped portion of each turn is approximately 60 degrees of the circumference of the turn.

10. The reactor of claim 1 wherein said flat portion of each turn occupies 270-300 degrees of the circumference of the turn.

11. The reactor of claim 1 wherein said RF coil has six 360 degree turns.

12. The reactor of claim 1 wherein said turns of RF coil are spaced at a pitch of ¾ inch.

13. A kit for a plasma etch chamber, comprising:
a dome-shaped vacuum pressure chamber window wall; and
an RF coil adapted to be disposed external to said chamber and adjacent to said window wall wherein said coil has a plurality of 360 degree turns including a first 360 degree turn, a second 360 degree turn and a plurality of 360 degree turns between said first and second 360 degree turns, each 360 degree turn being in close physical proximity to an adjacent 360 degree turn and being adapted to be wound around said window wall portion so that said window wall portion extends through an opening defined by at least a plurality of said turns, each 360 degree turn comprising a flat portion and a sloped portion interconnecting flat portions of adjacent 360 degree turns, wherein each flat portion of each 360 degree turn comprises a majority of the 360 degree turn.

14. The kit of claim 13 wherein said flat portions are parallel to each other.

15. The kit of claim 13 wherein said window wall is electrically insulative.

16. The kit of claim 15 wherein said window wall comprises quartz.

17. The kit of claim 15 wherein said window wall comprises a ceramic.

18. The kit of claim 13 wherein said RF coil is helix wound and cylindrically shaped.

19. The kit of claim 13 wherein said RF coil is spiral wound and dome-shaped.

20. The kit of claim 13 wherein said flat portion of each turn is approximately 300 degrees of the circumference of the turn and the sloped portion of each turn is approximately 60 degrees of the circumference of the turn.

21. The kit of claim 13 wherein said flat portion of each turn occupies 270-300 degrees of the circumference of the turn.

22. A kit for a plasma etch chamber having a dome-shaped window wall portion, comprising:
an RF coil adapted to be disposed external said chamber and adjacent to said window wall portion wherein said coil has a plurality of 360 degree turns including a first 360 degree turn, a second 360 degree turn and a plurality of 360 degree turns between said first and second 360 degree turns, each 360 degree turn being in close physical proximity to an adjacent 360 degree turn and being adapted to be wound around said window wall portion so that said window wall portion extends through an opening defined by at least a plurality of said turns, each 360 degree turn comprising a flat portion and a sloped portion interconnecting flat portions of adjacent 360 degree turns, wherein each flat portion of each 360 degree turn comprises a majority of the 360 degree turn.

23. The kit of claim 22 wherein said flat portions are parallel to each other.

24. The kit of claim 22 wherein said RF coil is helix wound and cylindrically shaped.

25. The kit of claim 22 wherein said RF coil is spiral wound and dome-shaped.

26. The kit of claim 22 wherein said flat portion of each turn is approximately 300 degrees of the circumference of the turn and the sloped portion of each turn is approximately 60 degrees of the circumference of the turn.

27. The kit of claim 22 wherein said flat portion of each turn occupies 270-300 degrees of the circumference of the turn.

28. The kit of claim 22 wherein said RF coil has six 360 degree turns.

29. The kit of claim 22 wherein said turns of RE coil are spaced at a pitch of ¾ inch.

* * * * *